United States Patent
Katakami et al.

(10) Patent No.: US 8,786,022 B2
(45) Date of Patent: Jul. 22, 2014

(54) SEMICONDUCTOR DEVICE AND SEMICONDUCTOR DEVICE MANUFACTURING METHOD

(75) Inventors: Akira Katakami, Yokohama (JP); Takayuki Aoyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/052,776

(22) Filed: Mar. 21, 2011

(65) Prior Publication Data

US 2011/0254106 A1  Oct. 20, 2011

(30) Foreign Application Priority Data

Apr. 16, 2010 (JP) ................. 2010-095105

(51) Int. Cl.
*H01L 27/092* (2006.01)

(52) U.S. Cl.
USPC ...................................... 257/369

(58) Field of Classification Search
USPC .......... 257/288, 365, 368, 390, 392, E29.255, 257/369; 438/154, 785, 786
See application file for complete search history.

(56) References Cited

U.S. PATENT DOCUMENTS

| | | | | |
|---|---|---|---|---|
| 7,821,059 B2* | 10/2010 | Shingu et al. | ................. | 257/324 |
| 7,833,849 B2* | 11/2010 | Callegari et al. | .............. | 438/158 |
| 7,994,036 B2* | 8/2011 | Mitsuhashi et al. | ........... | 438/585 |
| 8,071,447 B2* | 12/2011 | Inumiya et al. | ................ | 438/261 |
| 8,114,739 B2* | 2/2012 | Chowdhury et al. | .......... | 438/258 |
| 2004/0038538 A1* | 2/2004 | Ho et al. | ....................... | 438/694 |
| 2005/0148127 A1* | 7/2005 | Jung et al. | ..................... | 438/197 |
| 2005/0233526 A1* | 10/2005 | Watanabe et al. | ............. | 438/287 |
| 2006/0177997 A1* | 8/2006 | Lin et al. | ........................ | 438/584 |
| 2007/0001244 A1* | 1/2007 | Shimamoto et al. | ........... | 257/411 |
| 2007/0026597 A1* | 2/2007 | Nakajima | ...................... | 438/197 |
| 2008/0083956 A1* | 4/2008 | Mise et al. | ..................... | 257/408 |
| 2008/0128822 A1 | 6/2008 | Koyama et al. | | |
| 2008/0230854 A1* | 9/2008 | Clark | ............................ | 257/411 |
| 2008/0233288 A1* | 9/2008 | Clark | ..................... | 427/255.394 |
| 2008/0272433 A1* | 11/2008 | Alshareef et al. | ............. | 257/347 |
| 2009/0068807 A1* | 3/2009 | Karve et al. | .................... | 438/275 |
| 2009/0085175 A1* | 4/2009 | Clark et al. | .................... | 257/637 |
| 2009/0114996 A1* | 5/2009 | Inumiya et al. | ................ | 257/369 |
| 2009/0146216 A1* | 6/2009 | Nabatame et al. | ............. | 257/369 |

(Continued)

FOREIGN PATENT DOCUMENTS

| | | |
|---|---|---|
| JP | 2007-329237 A | 12/2007 |
| JP | 2009-54609 A | 3/2009 |
| JP | 2009-194352 A | 8/2009 |

OTHER PUBLICATIONS

Y. Kamimuta et al.; "Comprehensive Study of VFB Shift in High-k CMOS-Dipole Formation, Fermi-level Pinning and Oxygen Vacancy Effect", IEEE International Electron Meeting, 2007, pp. 341-344.

(Continued)

*Primary Examiner* — Michele Fan
(74) *Attorney, Agent, or Firm* — Westerman, Hattori, Daniels & Adrian, LLP

(57) ABSTRACT

A semiconductor device includes a gate insulation film formed over a semiconductor substrate; a cap film formed over the gate insulation film; a silicon oxide film formed over the cap film; a metal gate electrode formed over the silicon oxide film; and source/drain diffused layers formed in the semiconductor substrate on both sides of the metal gate electrode.

11 Claims, 10 Drawing Sheets

(56) References Cited

U.S. PATENT DOCUMENTS

| | | | |
|---|---|---|---|
| 2009/0212371 A1* | 8/2009 | Kobayashi | 257/369 |
| 2009/0242963 A1* | 10/2009 | Shingu et al. | 257/324 |
| 2009/0267162 A1* | 10/2009 | Nakajima | 257/410 |
| 2010/0001348 A1* | 1/2010 | Mitsuhashi et al. | 257/368 |
| 2010/0065918 A1* | 3/2010 | Ikeno et al. | 257/369 |
| 2010/0102393 A1* | 4/2010 | Lee et al. | 257/369 |
| 2010/0102395 A1* | 4/2010 | Yamamoto et al. | 257/369 |
| 2010/0133623 A1* | 6/2010 | Inumiya et al. | 257/369 |
| 2010/0133626 A1* | 6/2010 | Aoyama et al. | 257/379 |
| 2010/0164011 A1* | 7/2010 | Frank et al. | 257/369 |
| 2010/0176456 A1* | 7/2010 | Ikeno et al. | 257/369 |
| 2010/0187612 A1* | 7/2010 | Ikeno et al. | 257/369 |
| 2010/0207214 A1* | 8/2010 | Chuang et al. | 257/369 |
| 2010/0219481 A1* | 9/2010 | Tseng et al. | 257/369 |
| 2010/0224939 A1* | 9/2010 | Kim et al. | 257/369 |
| 2010/0317181 A1* | 12/2010 | Chung et al. | 438/585 |
| 2010/0317185 A1* | 12/2010 | Vos et al. | 438/591 |
| 2010/0327366 A1* | 12/2010 | Manabe et al. | 257/369 |
| 2011/0070702 A1* | 3/2011 | Chien et al. | 438/211 |
| 2011/0115027 A1* | 5/2011 | Jagannathan et al. | 257/369 |
| 2011/0215413 A1* | 9/2011 | Ikeno | 257/369 |
| 2011/0217833 A1* | 9/2011 | Lee et al. | 438/591 |
| 2011/0227163 A1* | 9/2011 | Wang et al. | 257/369 |
| 2011/0254106 A1* | 10/2011 | Katakami et al. | 257/410 |
| 2012/0025327 A1* | 2/2012 | Ji et al. | 257/411 |
| 2012/0045876 A1* | 2/2012 | Kawahara et al. | 438/231 |
| 2012/0061773 A1* | 3/2012 | Tsuchiya | 257/411 |
| 2012/0104506 A1* | 5/2012 | Wang et al. | 257/369 |

OTHER PUBLICATIONS

Japanese Office Action dated Dec. 10, 2013, issued in Japanese Patent Application No. 2010-095105, w/English translation, (4 pages).

* cited by examiner

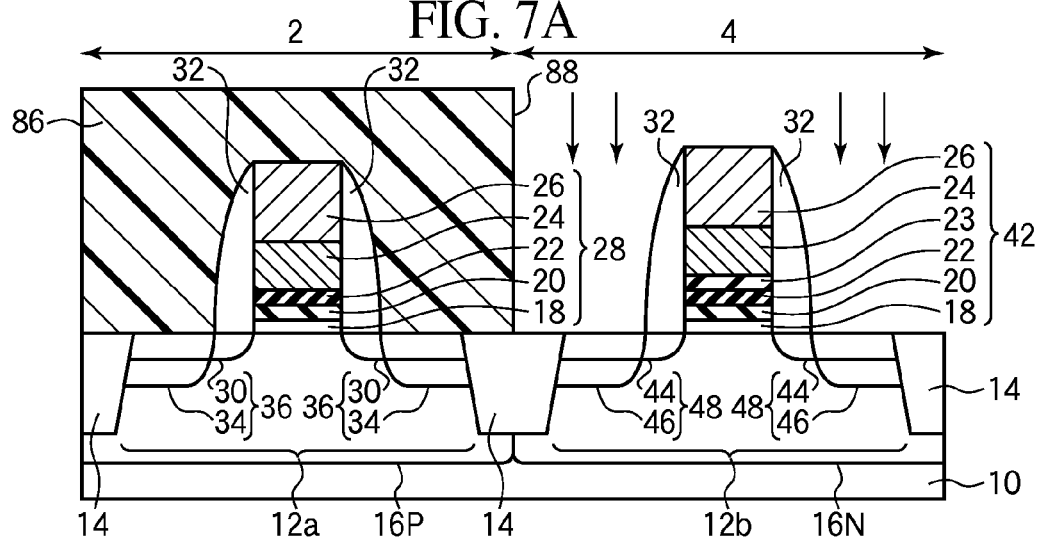
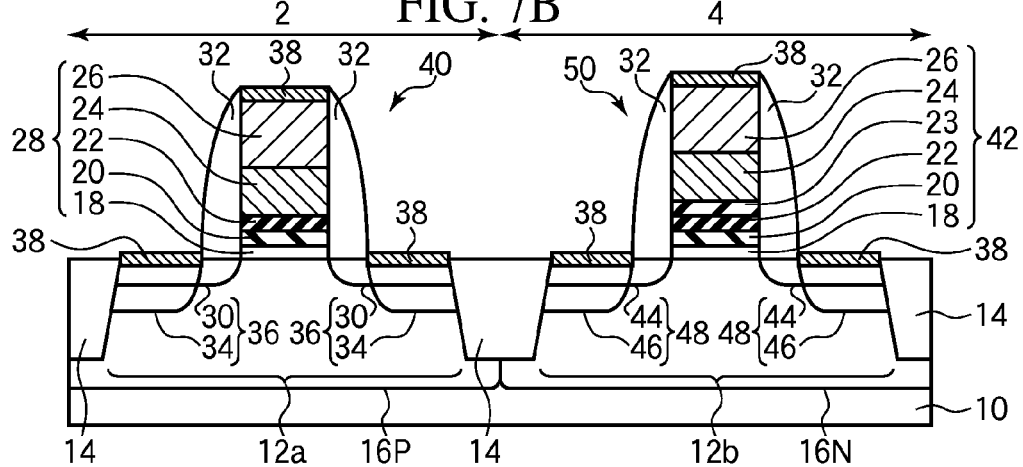
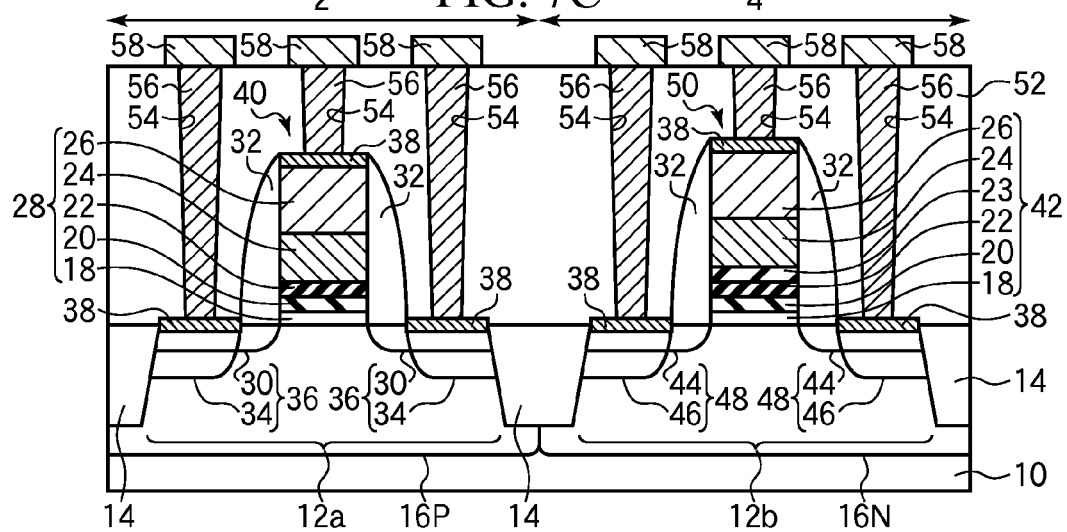

US 8,786,022 B2

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2010-95105, filed on Apr. 16, 2010, the entire contents of which are incorporated herein by reference.

FIELD

The embodiments discussed herein are related to a semiconductor device and a semiconductor device manufacturing method.

BACKGROUND

As semiconductor device is micronized, the use of high dielectric constant insulation film of hafnium oxide film, etc., whose relative dielectric constant is higher than that of silicon oxide film, as the gate insulation film of MIS (Metal Insulator Semiconductor) transistor is noted.

Also as the gate electrode of a MISFET, the use of a metal gate electrode in place of a gate electrode of polysilicon is noted. The use of the metal gate electrode can prevent the generation of a depletion layer in the gate electrode, and the current driving force of the MIS transistor can be improved.

Related reference is as follows:
Japanese Laid-open Patent Publication No. 2009-194352; and
Y. Kamimura et al., "Comprehensive Study of VFB Shift in High-k CMOS-Dipole Formation, Fermi-level Pinning and Oxygen Vacancy Effect-", IEEE International Electron Meeting, pp. 341-344, 2007.

SUMMARY

According to aspects of an embodiment, a semiconductor device includes a gate insulation film formed over a semiconductor substrate; a cap film formed over the gate insulation film; a silicon oxide film formed over the cap film; a metal gate electrode formed over the silicon oxide film; and a source/drain diffused layers formed in the semiconductor substrate on both sides of the metal gate electrode.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3A to 7C are sectional views of the semiconductor device in the steps of the semiconductor device manufacturing method according to the first embodiment, which illustrate the method.

DESCRIPTION OF EMBODIMENTS

In a transistor using a metal gate electrode and a high dielectric constant gate insulation film, a threshold voltage often becomes deep.

In order to make the threshold voltage shallow, it is an idea to form on the gate insulation film a cap film which contributes to making the threshold voltage shallow.

However, the cap film suitable to make the threshold voltage of the N-channel transistors shallow, and the cap film suitable to make the threshold voltage of the P-channel transistors shallow are different in the material.

It is not easy to form the cap film of different materials on the gate insulation film of the N-channel transistors and on the gate insulation film of the P-channel transistors.

Preferred embodiments of the present invention will be explained with reference to accompanying drawings.

[a] First Embodiment

A semiconductor device and a semiconductor device manufacturing method according to a first embodiment will be described with reference to FIGS. 1 to 7C.

(Semiconductor Device)

Figure 1:
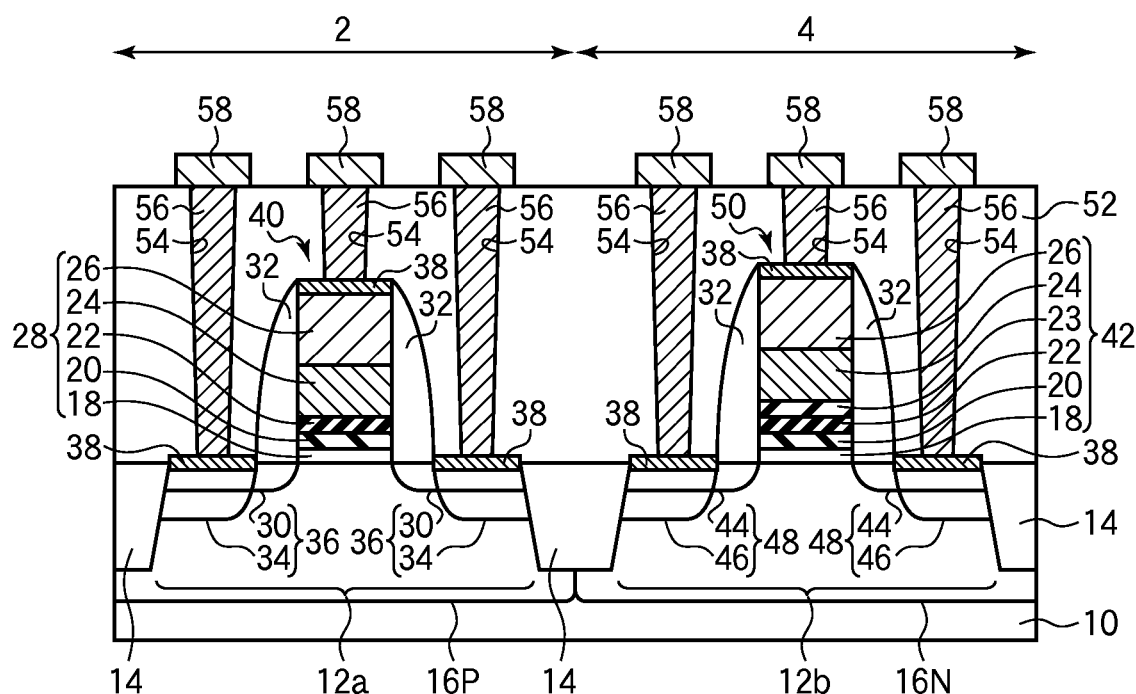
FIG. 1 is a sectional view of a semiconductor device according to a first embodiment.

First, the semiconductor device according to the first embodiment will be described with reference to FIG. 1. FIG. 1 is a cross-sectional view of the semiconductor device according to the present embodiment.

On the left side of the drawing of FIG. 1, a region for an N-channel MISFET to be formed in (N-channel MISFET forming region) 2 is illustrated. On the right side of the drawing of FIG. 1, a region for a P-channel MISFET to be formed in (P-channel MISFET forming region) 4 is illustrated.

As illustrated in FIG. 1, in the semiconductor substrate 10, device isolation regions 14 for defining active regions (device regions) 12a, 12b are formed. As the semiconductor substrate 10, a silicon substrate, for example, is used. The device isolation regions 14 are formed by, e.g., STI (Shallow Trench Isolation). The active region 12a on the left side of the drawing of FIG. 1 is an active region for the N-channel MISFET to be formed in. An active region 12b on the right side of the drawing of FIG. 1 is an active region for the P-channel MISFET to be formed in.

In the semiconductor substrate 10 in the N-channel MISFET forming region 2, a P-type well 16P is formed. In the semiconductor substrate 10 in the P-channel MISFET forming region 4, an N-type well 16N is formed.

First, an N-channel MISFET (a first transistor) 40 formed in the N-channel MISFET forming region 2 will be described.

On the active region 12a of the N-channel MISFET forming region 2, a silicon oxide film 18 of, e.g., a 0.5-2 nm-film thickness is formed.

On the silicon oxide film 18, a gate insulation film (high dielectric constant gate insulation film) 20 of high dielectric constant (High-K) insulation film of, e.g., a 1.5-3.0 nm-film thickness is formed. The high dielectric constant insulation film is an insulation film whose relative dielectric constant is higher than that of silicon oxide film. As the gate insulation film 20, an insulation film containing an oxide of Hf or an oxide of Zr, for example, can be used. For example, $HfO_2$, HfSiO, HfZrO, HfZrSiO, $ZrO_2$, ZrSiO, HfON, HfSiON, HfZrON, HfZrSiON, ZrON, ZrSiON or others can be used. As the gate insulation film 20, hafnium oxide film, for example, is used here.

On the gate insulation film 20, a cap film 22 of, e.g., a 0.1-0.5 nm-film thickness is formed. The cap film 22 is for shallowing the threshold voltage of the N-channel MISFET 40. As a material of the cap film, which can shallow the threshold voltage of the N-channel MISFET 40, an oxide of rare earth or an oxide of Mg (magnesium) can be used. As such rare earth metal, Y (yttrium), La (lanthanum), Dy (dysprosium) or others can be used. As the cap film 22, yttrium oxide ($Y_2O_3$), for example, is used here.

For the following reason, the cap film 22 of an oxide of rare earth metal or an oxide of Mg will lower the threshold voltage of the N-channel MISFET 40. That is, the rare earth atoms or the Mg atoms in the cap film 22 will be diffused to the interface (boundary) between the silicon oxide film 18 and the gate insulation film 20 by thermal processing or others. In the interfaces between the silicon oxide film 18 and the gate insulation film 20, dipoles will be generated by the rare earth atoms or the Mg atoms diffused to the interface between the silicon oxide film 18 and the gate insulation film 20. Such dipoles will be generated with the positive poles positioned on the side of the silicon oxide film 18 and the negative poles positioned on the side of the gate insulation film 20 (refer to Y. Kamimura et al., "Comprehensive Study of VFB Shift in High-k CMOS-Dipole Formation, Fermi-level Pinning and Oxygen Vacancy Effect", IEEE International Electron Meeting, pp. 341-344, 2007). Such directed dipoles will contribute to lowering the threshold voltage of the N-channel MISFET 40. For such reason, the cap film 22 of an oxide of rare earth metal or an oxide of Mg will lower the threshold voltage of the N-channel MISFET 40.

On the cap film 22, metal gate electrode 24 of, e.g., a 5-20 nm-film thickness is formed. As a material of the metal gate electrode 24, a material whose work function is near the middle of the band gap of silicon can be used. Such material can be, e.g., TiN, TaN or others. As the metal gate electrode 24, TiN film, for example, can be used here.

On the metal gate electrode 24, a silicon film 26 of, e.g., a 30-80 nm-film thickness is formed.

In the semiconductor substrate 10 on both sides of the layer structure 28 including the silicon oxide film 18, the gate insulation film 20, the cap film 22, the metal gate electrode 24 and the silicon film 26, N-type extension regions 30 forming the shallow regions of the extension source/drain structure are formed.

On the side walls of the layer structure 28, sidewall insulation film 32 of, e.g., silicon nitride film or others is formed.

In the semiconductor substrate 10 on both sides of the layer structure 28 with the sidewall insulation film 32 formed on, N-type impurity diffused regions 34 forming the deep regions of the extension source/drain structure are formed. The extension regions 30 and the impurity diffused regions 34 form the N-type source/drain diffused layers 36.

On the source/drain diffused layers 36 and on the silicon film 26, a silicide film 38 of, e.g., titanium silicide is formed. The silicide film 38 on the source/drain diffused layers 36 functions as the source/drain electrodes.

Thus, in the N-channel MISFET forming region 2, the N-channel MISFET 40 is formed.

Next, the P-channel MISFET (second transistor) 50 formed in the P-channel MISFET forming region 4 will be described.

On the active region 12b in the P-channel MISFET forming region 4, a silicon oxide film 18 is formed. The silicon oxide film 18 of the P-channel MISFET 50 is one and the same as the silicon oxide film 18 of the N-channel MISFET 40. The film thickness of the silicon oxide film 18 is, e.g., 0.5-2 nm.

On the silicon oxide film 18, a gate insulation film of high dielectric constant insulation film (high dielectric constant gate insulation film) 20 is formed. The gate insulation film 20 of the P-channel MISFET 50 is one and the same as the gate insulation film 20 of the N-channel MISFET 40. As described above, as the gate insulation film 20, an insulation film containing, e.g., an oxide of Hf or an oxide of Zr can be used. Specifically, as described above, as a material of the gate insulation film 20, for example, $HfO_2$, HfSiO, HfZrO, HfZrSiO, $ZrO_2$, ZrSiO, HfON, HfSiON, HfZrON, HfZrSiON, ZrON, ZrSiON or others can be used. As the gate insulation film 20, hafnium oxide, for example is used here. The film thickness of the gate insulation film 20 is, e.g., 1.5-3.0 nm.

On the gate insulation film 20, a cap film 22 is formed. The cap film 22 of the P-channel MISFET 50 is formed of one and the same cap film 22 of the N-channel MISFET 40. The film thickness of the cap film 22 is, e.g., 0.1-0.5 nm. As described above, the cap film 22 is for shallowing the threshold voltage of the N-channel MISFET 40. As a material of the cap film 22, an oxide of rare earth metal or an oxide of Mg is used as described above. As such rare earth metal, Y, La, Dy or others, for example, is used. As the cap film 22, yttrium oxide film, for example, is used here.

As described above, the rare earth atoms or the Mg atoms in the cap film 22 will be diffused by thermal processing, etc. to the interface between the silicon oxide film 18 and the gate insulation film 20. The rare earth atoms or the Mg atoms diffused to the interface between the silicon oxide film 18 and the gate insulation film 20 will generate dipoles in the interface between the silicon oxide film 18 and the gate insulation film 20. Such dipoles will be generated with the positive poles positioned on the side of the silicon oxide film 18 and the negative poles positioned on the side of the gate insulation film 20. Such directed dipoles will contribute to lowering the threshold voltage of the N-channel MISFET 40 but will act to deepened the threshold voltage of the P-channel MISFET 50.

On the cap film 22, a silicon oxide film 23 of, e.g., a 0.1-0.5 nm-film thickness is formed. The silicon oxide film 23 is not formed in the N-channel MISFET 40. The silicon oxide film 23 is for preventing the threshold voltage of the P-channel MISFET 50 from deepening. That is, in the P-channel MISFET 50, because of the silicon oxide film 23 formed on the cap film 22, dipoles will be generated also in the interface between the cap film 22 and the silicon oxide film 23. The dipoles generated in the interface between the cap film 22 and the silicon oxide film 23 will be generated with the negative poles positioned on the side of the cap film 22 and the positive poles positioned on the side of the silicon oxide film 23. That is, in the P-channel MISFET 50, the dipole moment opposite to the dipole moment generated in the interface between the silicon oxide film 18 and the gate insulation film 20 will be generated in the interface between the cap film 22 and the silicon oxide film 23. The dipoles generated in the interface between the silicon oxide film 18 and the gate insulation film 20 act to deepen the threshold voltage of the P-channel MISFET 50. On the other hand, the dipoles generated in the interface between the cap film 22 and the silicon oxide film 23 act to shallow the threshold voltage of the P-channel MISFET 50. Thus, according to the present embodiment, the dipole moment generated in the interface between the silicon oxide film 18 and the gate insulation film 20 can be compensated by the dipole moment generated in the interface between the cap film 22 and the silicon oxide film 23. Accordingly, in the present embodiment, the cap film 22 for shallowing the threshold voltage of the N-channel MISFET 40 is formed also in the P-channel MISFET 50, but the threshold voltage of the P-channel MISFET 50 can be preventing from deepening.

On the silicon oxide film 23, a metal gate electrode 24 of, e.g., a 5-20 nm-film thickness is formed. As a material of the metal gate electrode 24, a material whose work function is near the middle of the band gap of silicon can be used. As such material TiN, TaN or others can be used. As the metal gate electrode 24, TiN film, for example, is used here.

On the metal gate electrode 24, a silicon film 26 of, e.g., a 30-80 nm-film thickness is formed.

In the semiconductor substrate 10 on both sides of the layer structure 42 including the silicon oxide film 18, the gate insulation film 20, the cap film 22, the silicon oxide film 23 and the metal gate electrode 24 and the silicon oxide film 26, N-type extension regions forming the shallow regions of the extension source/drain structures are formed.

On the side wall of the layer structure 42, a sidewall insulation film 32 of, e.g., silicon nitride film or others is formed.

In the semiconductor substrate 10 on both sides of the layer structure 42 with the sidewall insulation film 32 formed on, P-type impurity diffused regions 46 forming the deep regions of the extension source/drain structure are formed. The extension regions 44 and the impurity diffused regions 46 form P-type source/drain diffused layers 48.

On the source/drain diffused layers 48 and on the silicon film 26, a silicide film 38 of, e.g., titanium silicide is formed. The silicide film 38 on the source/drain diffused layers 48 function as the source/drain electrodes.

Thus, in the P-channel MISFET forming region 4, the P-channel MISFET 50 is formed.

The N-channel MISFET 40 and the P-channel MISFET form CMISFET (Complementary Metal Insulator Semiconductor Field Effect Transistor).

On the semiconductor substrate 10 with the N-channel MISFET 40 and the P-channel MISFET 50 formed on, an inter-layer insulation film 52 of a silicon oxide film of, e.g., a 300-600 nm-film thickness is formed.

In the inter-layer insulation film 52, contact holes 54 are formed respectively down to the silicide film 38 and the source/drain electrodes 38.

In the contact holes 54, conductor plugs 56 of, e.g., tungsten are buried in.

On the inter-layer insulation film 52 with the conductor plugs 56 buried in, interconnection layers 58 respectively connected to the conductor plugs 56 are formed.

Thus, the semiconductor device according to the present embodiment is formed.

(Evaluation Result)

Next, the evaluation result of the semiconductor device according to the present embodiment will be described with reference to FIG. 2.

Figure 2:
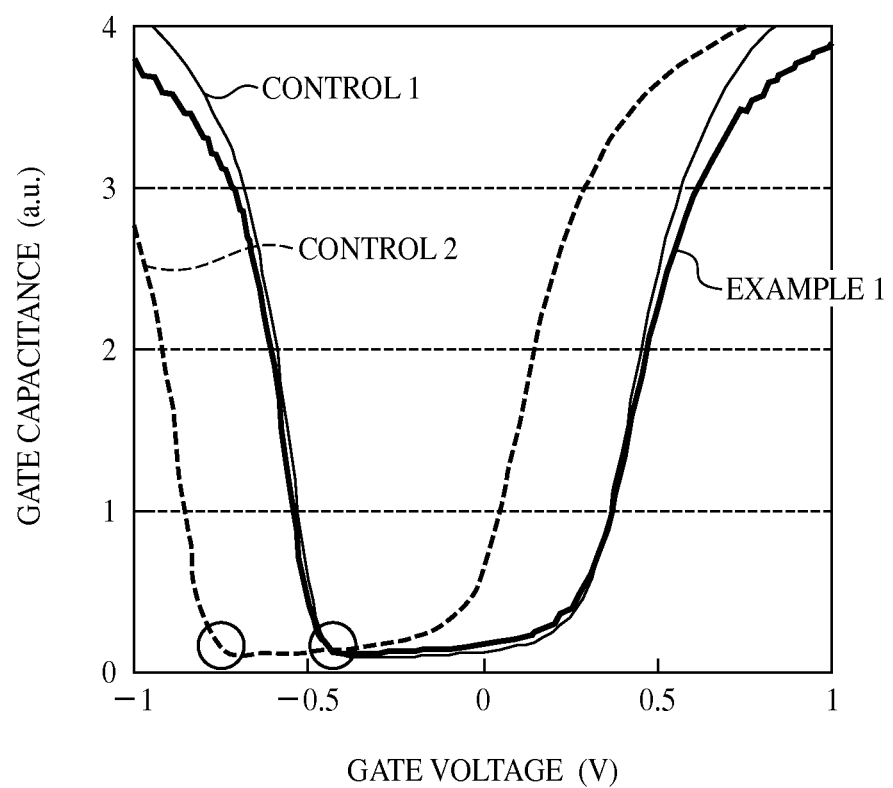
FIG. 2 is a graph of C-V characteristics of a P-channel MISFET.

FIG. 2 is a graph of the C-V characteristics of the P-channel MISFET. In FIG. 2, the gate voltage is taken on the horizontal axis. In FIG. 2, on the vertical axis, the gate capacitance is taken. When the C-V characteristics were measured, the gate electrodes were connected to the GND (ground), and the semiconductor substrate, the source terminals and the drain terminals are short-circuited, and high-frequency voltage of 1 MHz was applied to the semiconductor substrate, the source terminals and the drain terminals.

In FIG. 2, Control 1 indicates the case where neither the cap film 20 nor the silicon oxide film 22 is formed.

In FIG. 2, Control 2 indicates the case where the cap film 20 is formed, but the silicon oxide film 22 is not formed.

In FIG. 2, Example 1 indicates the present embodiment, i.e., the case where both the cap film 20 and the silicon oxide film 22 are formed.

As seen in FIG. 2, the C-V characteristics of Control 2 is shifted to the negative side in comparison with that of Control 1.

In FIG. 2, the parts surrounded by the circle marks are the points where, as the gate voltage is gradually lowered, the gate capacitance extremely rises, i.e., correspond to the threshold voltages. As seen in FIG. 2, in Control 2, the threshold voltage is deeper in comparison with that of Control 1.

Based on this, it is seen that with the cap film 20 formed, the threshold voltage of the P-channel MISFET is deeper than without the cap film 20 and the silicon oxide film 22 formed.

As seen in FIG. 2, in Example 1, the C-V characteristics do not shift to the negative side and is substantially the same as the C-V characteristics of Control 1.

As seen in FIG. 2, the threshold voltage of Example 1 is substantially equal to the threshold voltage of Control 1.

Based on this, it is seen that the present embodiment can prevent the threshold voltage of the P-channel MISFET from deepening.

As described above, in the present embodiment, the silicon oxide film 23 is formed on the cap film 22 of the P-channel MISFET 50, whereby according to the present embodiment, in spite of the cap film 22 for shallowing the threshold voltage of the N-channel MISFET 40 formed in the P-channel MISFET 50, the threshold voltage of the P-channel MISFET 50 can be prevented from deepening. Thus, according to the present embodiment, the threshold voltages of both the N-channel MISFET 40 and the P-channel MISFET 50 can be shallowed, and a semiconductor device including CMISFET of good electric characteristics can be provided.

(Semiconductor Device Manufacturing Method)

Next, the semiconductor device manufacturing method according to the present embodiment will be described with reference to FIGS. 3A to 7C. FIGS. 3A to 7C are cross-sectional views in the steps of the semiconductor device manufacturing method according to the present embodiment, which illustrate the method.

Figure 3A:
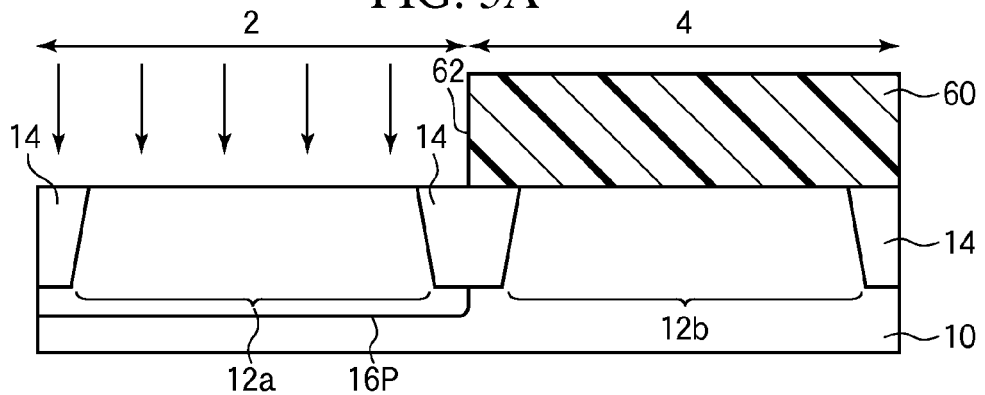

First, the device isolation regions 14 for defining the active regions (device regions) 12a, 12b are formed by, e.g., STI (see FIG. 3A). As the semiconductor substrate 10, a silicon substrate, for example, is used. The active region 12a on the left side of the drawing of FIG. 3A is the active region for N-channel MISFET to be formed in. The active region 12b on the right side of the drawing of FIG. 3A is the active region for P-channel MISFET to be formed in.

Next, a photoresist film 60 is formed on the entire surface by spin coating.

Next, in the photoresist film 60, an opening 62 for exposing the N-channel MISFET forming region 2 is formed.

Next, with the photoresist film 60 as the mask, a P-type dopant impurity is implanted by, e.g., ion implantation to form the P-type well 16P in the semiconductor substrate 10 in the N-channel MISFET forming region 2.

Then, the photoresist film 60 is released by, e.g., ashing.

Figure 3B:
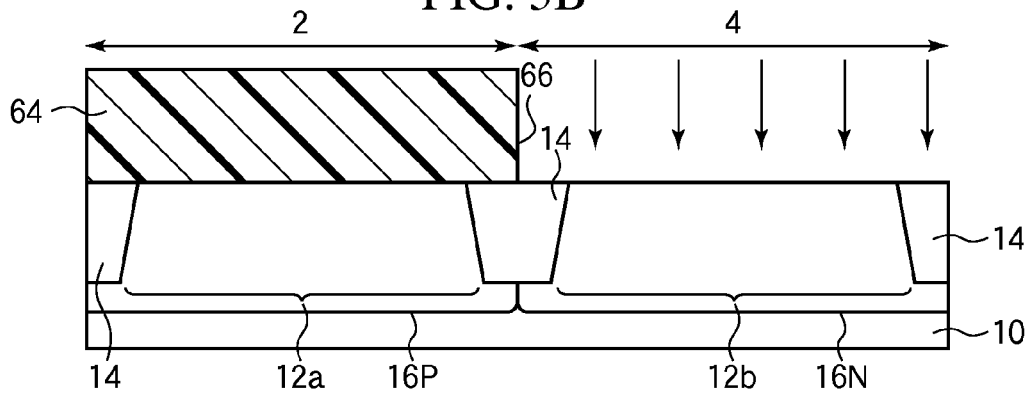

Next, as illustrated in FIG. 3B, a photoresist film 64 is formed on the entire surface by spin coating.

Then, in the photoresist film 64, an opening 66 for exposing the P-channel MISFET forming region 4 is formed.

Next, with the photoresist film 64 as the mask, an N-type dopant impurity is implanted by, e.g., ion implantation to form the N-type well 16N in the semiconductor substrate 10 in the P-channel MISFET forming region 4.

Then, the photoresist film 64 is released by, e.g., ashing.

Figure 3C:
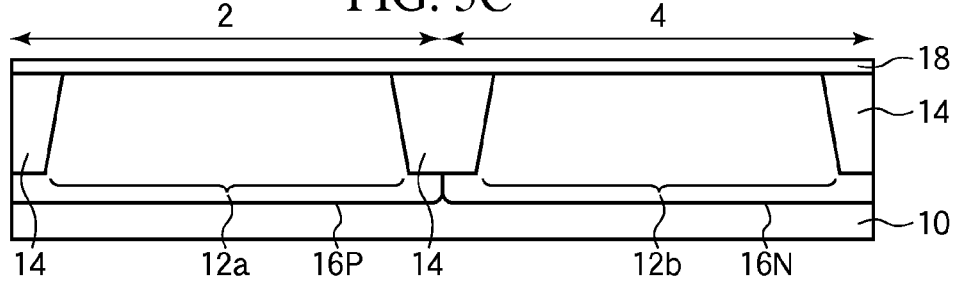

Next, as illustrated in FIG. 3C, the silicon oxide film 18 of, e.g., a 0.5-2 nm-film thickness is formed on the entire surface by, e.g., thermal oxidation. The film forming temperature is set at, e.g., 1000° C. The atmosphere in the film forming chamber is, e.g., oxygen atmosphere.

Figure 3D:
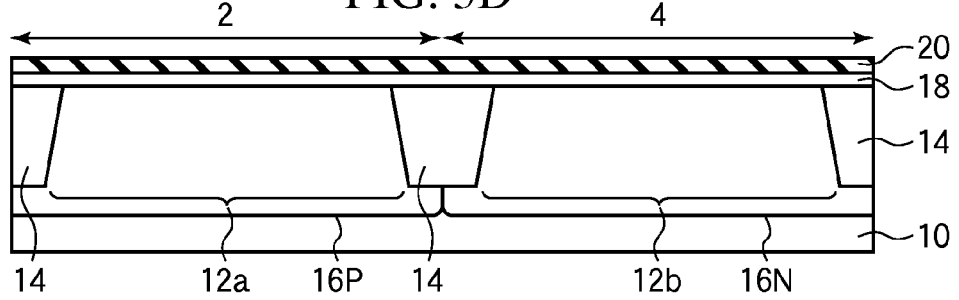

Then, as illustrated in FIG. 3D, the gate insulation film of high dielectric constant film (high dielectric constant gate insulation film) 20 of, e.g., a 1.5-3.0 nm-film thickness is formed on the entire surface by, e.g., ALD (Atomic Layer Deposition). As the gate insulation film 20, insulation film containing an oxide of Hf or an oxide of Zr, for example, is used. More specifically, as a material of the gate insulation film 20, for example, $HfO_2$, HfSiO, HfZrO, HfZrSiO, $ZrO_2$, ZrSiO, HfON, HfSiON, HfZrON, HfZrSiON, ZrON, ZrSiON or others is used. As the gate insulation film 20, hafnium oxide film, for example, is used here. When hafnium oxide film is formed as the gate insulation film 20, HTB (Hafnium-Tetra-t-Butoxide), for example, is used as the raw material. The atmosphere in the film forming chamber is, e.g., a mixed atmosphere of HTB, helium and nitrogen. The film forming temperature is set at, e.g., 300-600° C. The pressure in the film forming chamber is set at, e.g., 0.3-1.0 Pa.

Figure 4A:
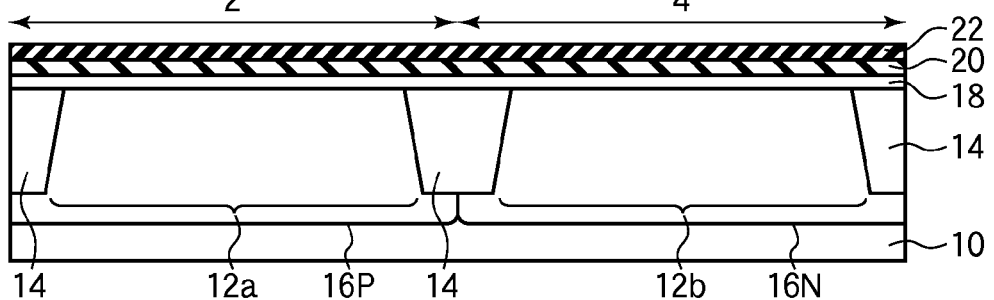

Then, as illustrated in FIG. 4A, the cap film 22, for example, is formed on the entire surface by, e.g., sputtering. The cap film 22 is for shallowing the threshold voltage of the N-channel MISFET 40. As a material of the cap film 22 which can lower the threshold voltage of the N-channel MISFET 40, an oxide of rare earth metal or an oxide of Mg is used. As the rare earth metal, Y, La, Dy or others, for example, is used. As the cap film 22, yttrium oxide film, for example, is used here. The film thickness of the cap film 22 is set at, e.g., about 0.1-0.5 nm. The film forming temperature is set at, e.g., the room temperature. The pressure in the film forming chamber is set at, e.g., about $1\times10^{-2}$-$1\times10^{-3}$ Pa. The atmosphere in the film forming chamber is, e.g., argon atmosphere.

Figure 4B:
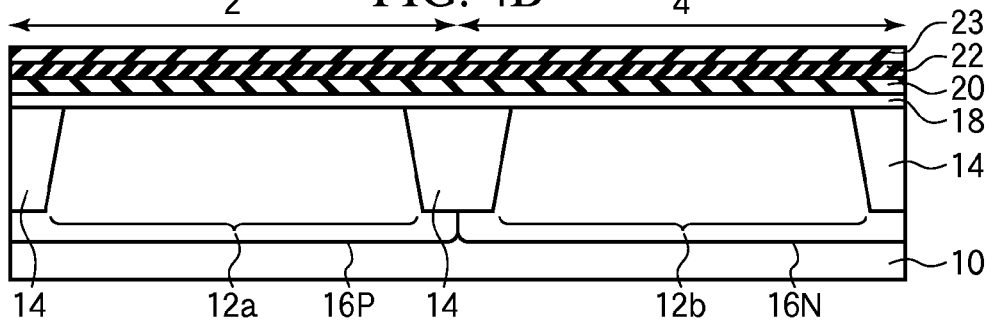

Next, as illustrated in FIG. 4B, the silicon oxide film 23 of, e.g., a 0.1-0.5 nm film thickness is formed on the entire surface by, e.g., ALD. As a raw material, dichlorosilane is used. The atmosphere in the film forming chamber is, e.g. a mixed atmosphere of, e.g., dichlorosilane, helium and nitrogen. The film forming temperature is set at, e.g., about 300-600° C. The pressure in the film forming chamber is set at, e.g., 0.3-1.0 Pa.

Next, a photoresist film 68 is formed on the entire surface by spin coating.

Figure 4C:
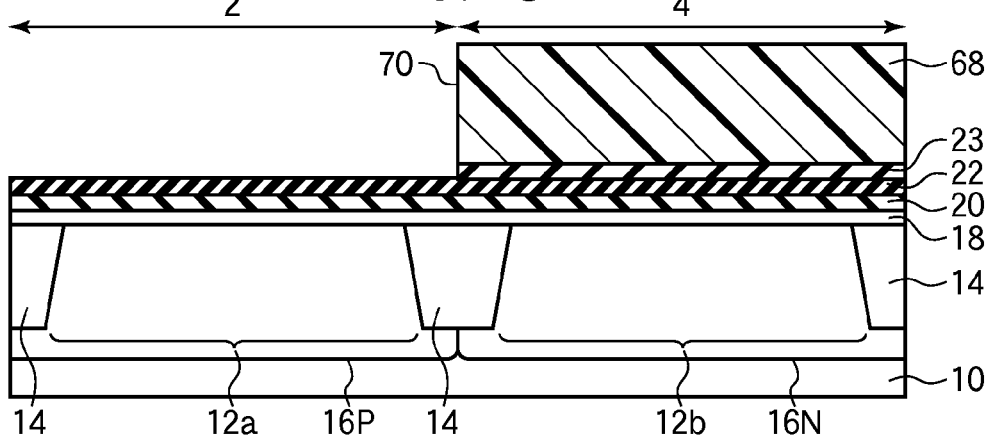

Then, in the photoresist film 68, an opening 70 for exposing the N-channel MISFET forming region 2 is formed (see FIG. 4C).

Then, the silicon oxide film 23 in the N-channel MISFET forming region 2 is etched off by wet etching. As an etchant, dilute fluoric acid of, e.g., about 0.2% concentration is used.

Then, the photoresist film 68 is released by, e.g., asking.

Next, plasma nitrization is made. Te substrate temperature is set at, e.g., about 150-300° C. The pressure in the chamber is set at, e.g., about 0.03-0.1 Torr.

Next, annealing (thermal processing) is made. This thermal processing is for diffusing the rare earth atoms, etc. in the cap film 22 to the interface between the gate insulation film 20 and the silicon oxide film 18 and also for recovering damages of the cap film 22, etc. The temperature of the thermal processing is set at, e.g., about 850-1050° C. The atmosphere in the chamber is, e.g., nitrogen atmosphere. The thermal processing period of time is set at, e.g., about 5-10 seconds.

Figure 4D:
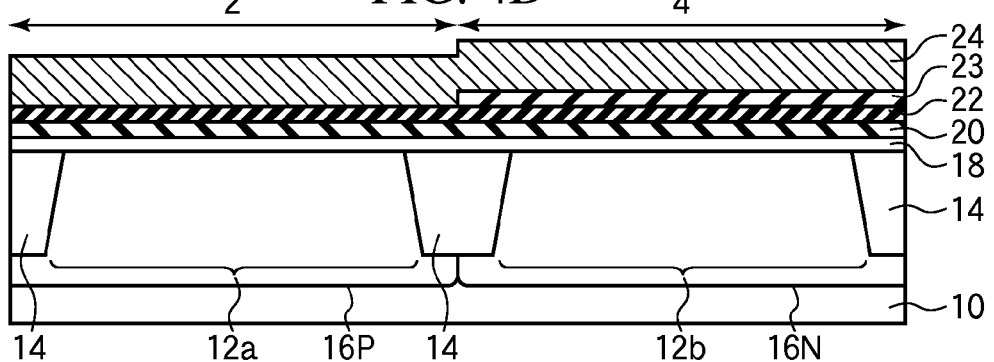

Then, as illustrated in FIG. 4D, the conduction film 24 of, e.g., a 5-20 nm-film thickness is formed by, e.g., sputtering. As a material of the conduction film 24, preferably, a material whose work function is near the middle of the band gap of silicon is used. Such material is, e.g., TiN, TaN or others. As the conduction film 24, TiN film, for example, is formed here. The film forming temperature is set at, e.g., about the room temperature to 300° C. The pressure in the film forming chamber is set at, e.g., about $1\times10^{-2}$-$1\times10^{-3}$ Pa. The atmosphere in the film forming chamber is, e.g., a mixed atmosphere of, e.g., argon and nitrogen.

Figure 5A:
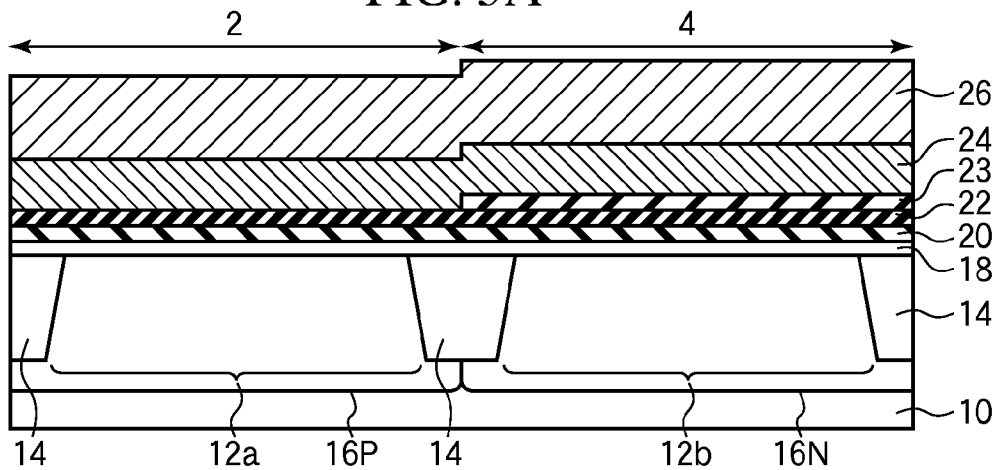

Next, as illustrated in FIG. 5A, the silicon film 26 of, e.g., a 30-80 nm-film thickness is formed on the entire surface by, e.g., CVD. The film forming temperature is set at, e.g., about 500-700° C. The crystallinity of the silicon film 26 can be polycrystal or amorphous state.

Then, a photoresist film 72 is formed on the entire surface by spin coating.

Figure 5B:
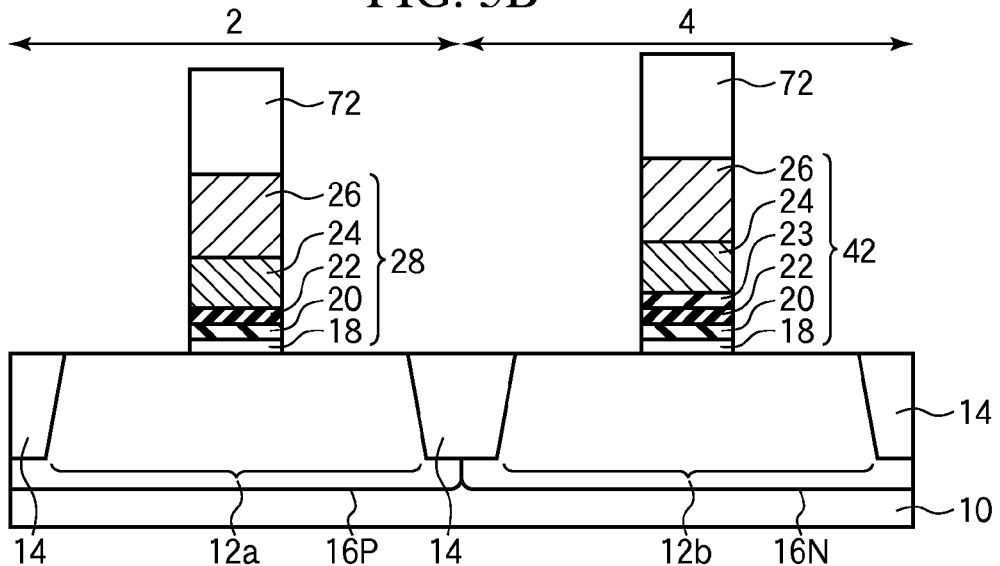

Next, by photolithography, the photoresist film 72 is patterned into the configuration of the metal gate electrodes 24 (see FIG. 5B).

Then, with the photoresist film 72 as the mask, the silicon film 26 and the conduction film 24 are etched by, e.g., RIE (Reactive Ion Etching). As an etching gas, CF-based gas and Cl-based gas, for example, are sued.

Then, with the photoresist film 72 as the mask, the silicon oxide film 23, the cap film 22, the gate insulation film 20 and the silicon oxide film 18 are etched by, e.g., wet etching. As an etchant, dilute fluoric acid or others, for examples, is used.

Then, the photoresist film 72 is released by, e.g., ashing.

Thus, on the active region 12a in the N-channel MISFET forming region 2, the layer structure 28 including the silicon oxide film 18, the gate insulation film 20, the cap film 22, the metal gate electrode 24 and the silicon film 26 is formed. Also on the active region 12b in the P-channel MISFET forming region 4, the layer structure 42 including the silicon oxide film 18, the gate insulation film 20, the cap film 22, the silicon oxide film 23, the metal gate electrode 24 and the silicon film 26 is formed.

Then, a photoresist film 74 is formed on the entire surface by spin coating.

Next, by photolithography, the opening 76 for exposing the N-channel MISFET forming region 2 is formed in the photoresist film 74.

Figure 5C:
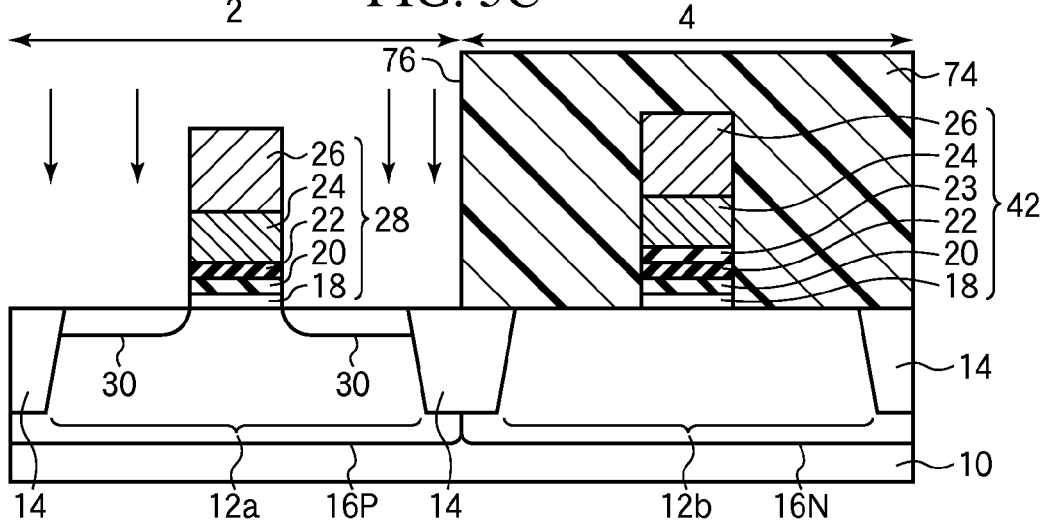

Then, with the photoresist film 74 and the layer structure 28 as the mask, an N-type dopant impurity is implanted by, e.g., ion implantation to form the N-type extension regions 30 in the semiconductor substrate 10 on both sides of the metal gate electrode 24 (see FIG. 5C). As the dopant impurity, As (arsenic), for example, is used. The acceleration energy is set at, e.g., about 1-3 keV. The dose is set at, e.g., about $6\times10^{14}$-$2\times10^{15}$ $cm^{-2}$.

Then, the photoresist film 74 is released by ashing.

Next, a photoresist 78 is formed on the entire surface by spin coating.

Figure 6A:
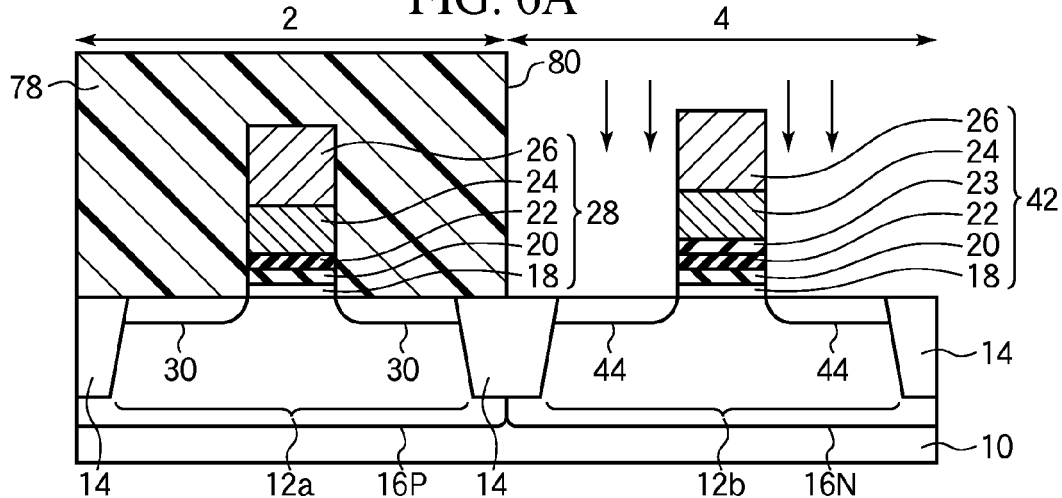

Next, by photolithography, the opening 80 for exposing the P-channel MISFET forming region 4 is formed in the photoresist film 78 (see FIG. 6A).

Next, with the photoresist film 78 and the layer structure 42 as the mask, a P-type dopant impurity is implanted by, e.g., ion implantation to form the P-type extension regions 44 in the semiconductor substrate 10 on both sides of the metal gate electrode 24. As the dopant impurity, B (boron), for example, is sued. The acceleration energy is set at, e.g., about 0.3-0.8 keV. The dose is set at, e.g., about $6\times10^{14}$-$2\times10^{15}$ $cm^{-2}$.

Then, the photoresist film 78 is released by, e.g., asking.

Next, the insulation film 32 of, e.g., a 20-60 nm-film thickness is formed by, e.g., CVD. As the insulation film 32, silicon nitride film, for example, is formed. The film forming temperature is set at, e.g., about 300-600° C. The atmosphere in the film forming chamber is, e.g., a mixed atmosphere of dichlorosilane and ammonium gas.

Figure 6B:
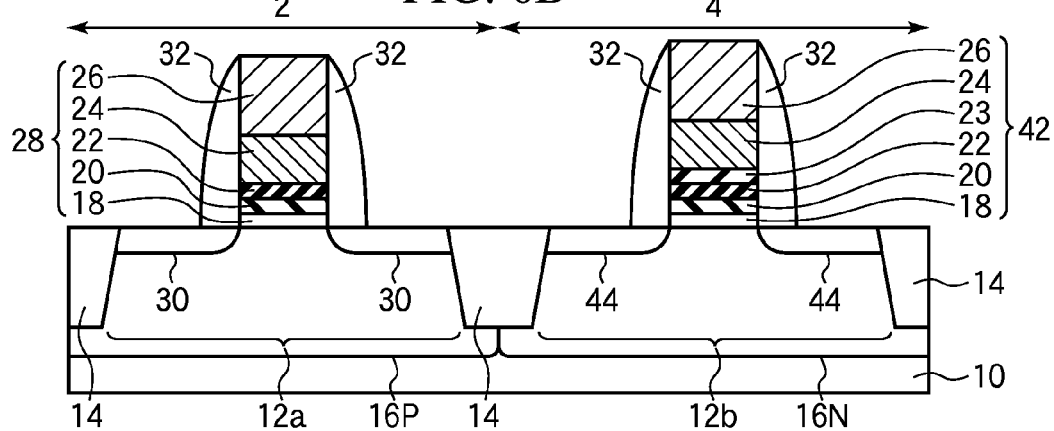
Figure 6C:
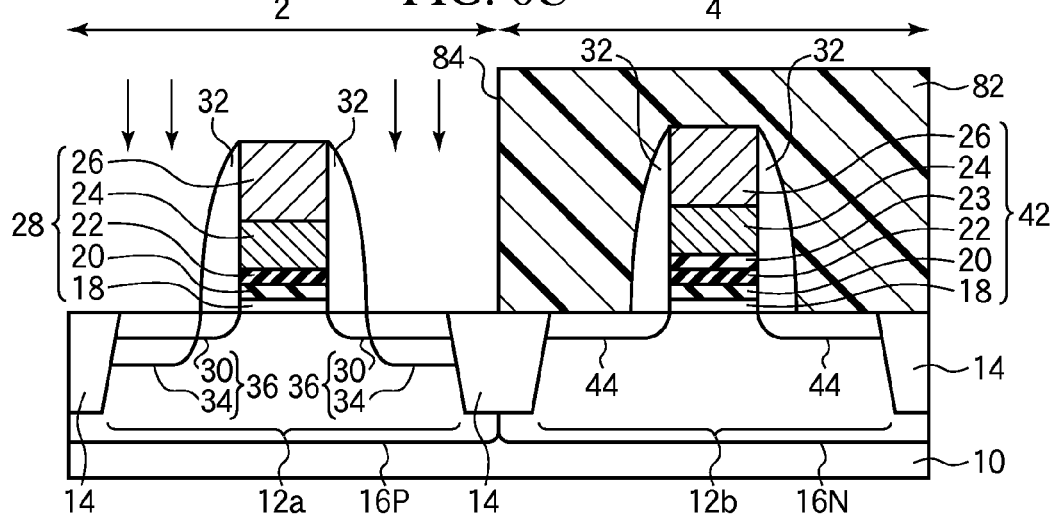

Next, the insulation film 32 is etched back by, e.g., RIE to form the sidewall insulation film 32 on the side walls of the layer structures 28, 42 (see FIG. 6B). As the etching gas, CF-based gas, for example, can be used.

The material of the sidewall insulation film 32 is not limited to silicon nitride film. The sidewall insulation film 32 may be formed of, e.g., silicon oxide film or silicon nitride oxide film.

Next, a photoresist film 82 is formed on the entire surface by spin coating.

Next, by photolithography, the opening 84 for exposing the N-channel MISFET forming region 2 is formed in the photoresist film 82.

Next, with the photoresist film 82, the layer structure 28 and the sidewall insulation film 32 as the mask, an N-type dopant impurity is implanted by, e.g., ion implantation to form the N-type diffused regions 34 in the semiconductor substrate 10 on both sides of the metal gate electrode 24. As the dopant impurity, As, for example, is used. The acceleration energy is set at, e.g., about 10-20 keV. The dose is set at, e.g., about $3 \times 10^{15}$-$1 \times 10^{16}$ cm$^{-2}$. The extension regions 30 and the impurity diffused regions 34 form the N-type source/drain diffused layers 36 (see FIG. 6C).

Then, the photoresist film 82 is released by, e.g., ashing.

Next, a photoresist film 86 is formed on the entire surface by spin coating.

Next, by photolithography, the opening 88 for exposing the P-channel MISFET forming region 4 is formed in the photoresist film 86 (see FIG. 7A).

Next, with the photoresist film 86, the layer structure 42 and the sidewall insulation film 32 as the mask, a P-type dopant impurity is implanted by, e.g., ion implantation to form the P-type impurity diffused regions 46 in the semiconductor substrate 10 on both sides of the metal gate electrode 24. As the dopant impurity, BF$_2$, for example, is used. The acceleration energy is set at, e.g., about 10-20 keV. The dose is set at, e.g., about $3 \times 10^{15}$-$1 \times 10^{16}$ cm$^{-2}$. The extension regions 44 and the impurity diffused regions 46 form the P-type source/drain diffused layers 48.

Then, the photoresist film 86 is released by, e.g., ashing.

Then, a refractory metal film of, e.g., an about 5-20 nm-film thickness is formed by, e.g., PVD (Physical Vapor Deposition) or CVD. As a material of the refractory metal film, Ti (titanium), W (tungsten), Co (cobalt), Ni (nickel) or others, for example, can be used. As the refractory metal film, Ti film, for example, is used here.

Then, thermal processing is made to react the Si atoms in the semiconductor substrate 10 and the Ti atoms in the refractory metal film with each other while reacting the Si atoms in the silicon film 26 and the Ti atoms in the refractory metal film with each other.

Next, that of the refractory metal film, which has not reacted is removed. Thus, the silicide film 38 of, e.g., titanium silicide is formed on the source/drain diffused layers 36, 48 and on the silicon film 26 (see FIG. 7B). The silicide film 38 on the source/drain diffused layers 36, 48 function as the source/drain electrodes.

Thus, in the N-channel MISFET forming region 2, the N-channel MISFET 40 is formed, and the P-channel MISFET 50 is formed in the P-channel MISFET forming region 4.

Next, on the entire surface, the inter-layer insulation film 52 of a silicon oxide film of, e.g., a 300-600 mm-film thickness is formed by, e.g., CVD.

Next, by photolithography, the contact holes 54 which arrive at the silicide film 38 and the source/drain electrodes 38 are formed.

Next, a Ti film of a 3-10 nm-film thickness, a TiN film of a 5-10 nm-film thickness are sequentially stacked by, e.g., sputtering. Thus, the barrier film (not illustrated) of the layer film is formed.

Then, a tungsten film of a 100-300 nm-film thickness is formed by, e.g., CVD.

Next, by, e.g., CMP (Chemical Mechanical Polishing), the tungsten film is polished until the surface of the inter-layer insulation film 52 is exposed. Thus, the conductor plugs 56 of, e.g. tungsten are buried in the contact holes 54.

Then, the conduction film 58 of a 1-3 µm-film thickness is formed by, e.g., PVD. As the conduction film 58, aluminum or others, for example, is used.

Next, the conduction film 58 is patterned by photolithography to form the interconnection layers 58 of the conduction film. Thus, the interconnection layers 58 connected to the conduction plugs 56 are formed.

Thus, the semiconductor device according to the present embodiment is manufactured (see FIG. 7C).

As described above, in the present embodiment, the cap film 22 for shallowing the threshold voltage of the N-channel MISFET 40 is formed both in the N-channel MISFET 40 and the P-channel MISFET 50. On the cap film 22 of the P-channel MISFET 50, the silicon oxide film 23 for preventing the threshold voltage of the P-channel MISFET from deepening is formed. Thus, according to the present embodiment, the threshold voltage of both the N-channel MISFET 40 and the P-channel MISFET 50 including the metal gate electrode 24 and the high dielectric constant gate insulation film 20 can be shallowed.

Furthermore, according to the present embodiment, the silicon oxide film 23 is formed on the cap film 22, and the silicon oxide film 23 in the N-channel MISFET forming region 2 is only etched. According to the present embodiment, a semiconductor device of good electric characteristics can be manufactured without drastically increasing the manufacturing cost.

[b] Second Embodiment

A semiconductor device and a semiconductor device manufacturing method according to a second embodiment will be described with reference to FIGS. 8 to 10C. The same members of the present embodiment as those of the semiconductor device and the semiconductor device manufacturing method according to the first embodiment illustrated in FIGS. 1 to 7C are represented by the same reference numbers not to repeat or to simply their description.

(Semiconductor Device)

Figure 8:
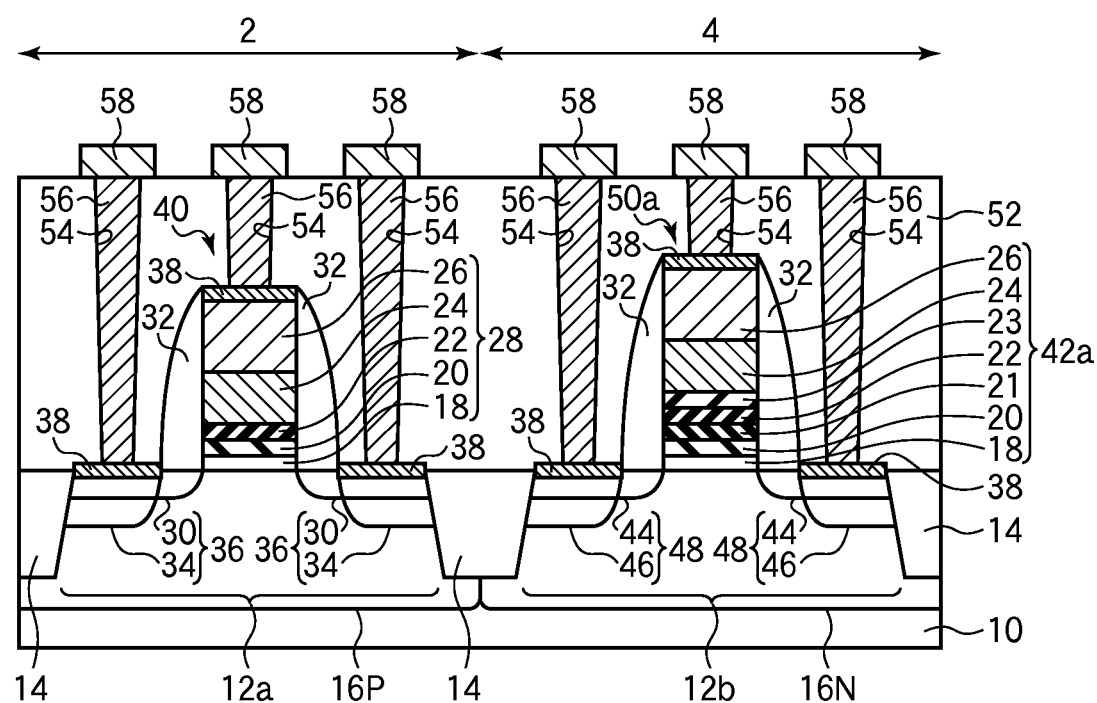
FIG. 8 is a sectional view of the semiconductor device according to a second embodiment.

First, the semiconductor device according to the present embodiment will be described with reference to FIG. 8. FIG. 8 is a sectional views of the semiconductor device according to the present embodiment, which illustrates the semiconductor device.

The semiconductor device according to the present embodiment is characterized mainly in that an aluminum oxide (Al$_2$O$_3$) film 21 is formed between the gate insulation film 20 and the cap film 22 in P-channel MISFET 50a.

As illustrated in FIG. 8, the aluminum oxide film 21 is formed between the gate insulation film 20 and the cap film 22 of the P-channel MISFET 50a. The aluminum oxide film 21 contributes to shallowing the threshold voltage of the P-channel MISFET 50a. The film thickness of the aluminum oxide film 21 is set at, e.g., about 0.1-1.0 nm.

In the P-channel MISFET forming region 4, layer structure 42a including a silicon oxide film 18, the gate insulation film 20, aluminum oxide film 21, the cap film 22, a silicon oxide film 23, metal gate electrode 24 and a silicon film 26 is formed.

On the other hand, between the gate insulation film 20 and the cap film 22 of the N-channel MISFET 40, the aluminum oxide film 21 is not formed.

In the present embodiment, the aluminum oxide film 21 is formed between the gate insulation film 20 and the cap film 22 of the P-channel MISFET 50a for the following reason.

That is, in the present embodiment as well as in the first embodiment, because of the cap film 22 formed also in the P-channel MISFET 50a, dipoles due to the presence of the cap film 22 will be generated also in the interface between the silicon oxide film 18 and the gate insulation film 20. The dipoles generated in the interface between the silicon oxide film 18 and the gate insulation film 20 due to the presence of the cap film 22 will be formed with the positive poles positioned on the side of the silicon oxide film 18 and the negative poles positioned on the side of the gate insulation film 20. Such directed dipoles will act to deepen the threshold voltage of the P-channel MISFET 50a.

In the present embodiment as well as in the first embodiment, the silicon oxide film 23 is formed on the cap film 22. Resultantly, in the present embodiment, dipoles due to the presence of the silicon oxide film 23 will be generated in the interface between the cap film 22 and the silicon oxide film 23 of the P-channel MISFET 50a. The dipoles generated in the interface between the cap film 22 and the silicon oxide film 23 due to the presence of the silicon oxide film 23 will be generated with the negative poles positioned on the side of the cap film 22 and the positive poles positioned on the side of the silicon oxide film 23. Such directed dipoles will act to shallow the threshold voltage of the P-channel MISFET 50a.

In the present embodiment, furthermore, the aluminum oxide film 21 is formed between the gate insulation film 20 and the cap film 22 of the P-channel MISFET 50a. Resultantly, in the present embodiment, dipoles will be generated in the interface between the silicon oxide film 18 and the gate insulation film 20 due to the presence of the aluminum oxide film 21. The dipoles generated in the interface between the silicon oxide film 18 and the gate insulation film 20 due to the presence of the aluminum oxide film 21 will be generated with the negative poles positioned on the side of the silicon oxide film 18 and the positive poles positioned on the side of the gate insulation film 20. Such directed dipoles will act to shallow the threshold voltage of the P-channel MISFET 50a.

As described above, in the present embodiment, the dipole moment opposite to the die pole moment generated due to the presence of the cap film 22 could be generated by the presence of the silicon oxide film 23 and the aluminum oxide film 21. The magnitude of the dipole moment generated due to the presence of the silicon oxide film 23 and the aluminum oxide film 21 can be made higher that the magnitude of the dipole moment generated due to the presence of the cap film 22. Thus, according to the present embodiment, the threshold voltage of the P-channel MISFET 50a can be further shallowed. According to the present embodiment, a semiconductor device including CMISFET of better electric characteristics can be provided.

(Semiconductor Device Manufacturing Method)

Next, the semiconductor device manufacturing method will be described with reference to FIGS. 9A to 10C. FIGS. 9A to 10C are cross-sectional views of the semiconductor device in the steps of the semiconductor device manufacturing method according to the present embodiment.

Figure 9A:
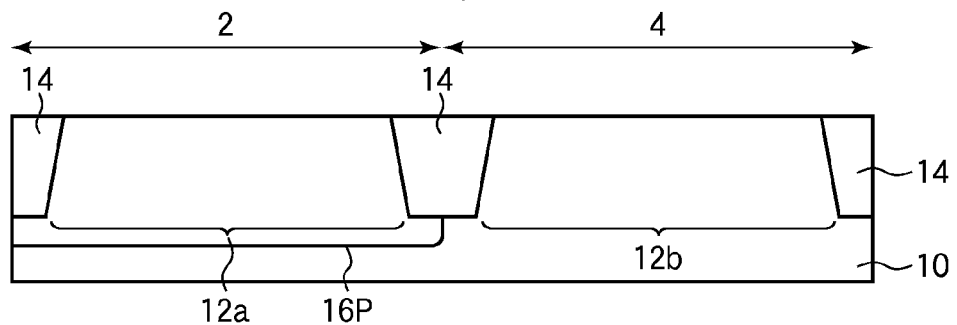
FIGS. 9A to 10C are sectional views of the semiconductor device in the steps of the semiconductor device manufacturing method, which illustrate the method.

First, the step of forming the device isolation regions 14 to the step of forming the P-type well 16 and the P-type well 16N are the same as those of the semiconductor device manufacturing method according to the first embodiment illustrated in FIGS. 3A and 3B, and their description will not be repeated (see FIG. 9A).

Figure 9B:
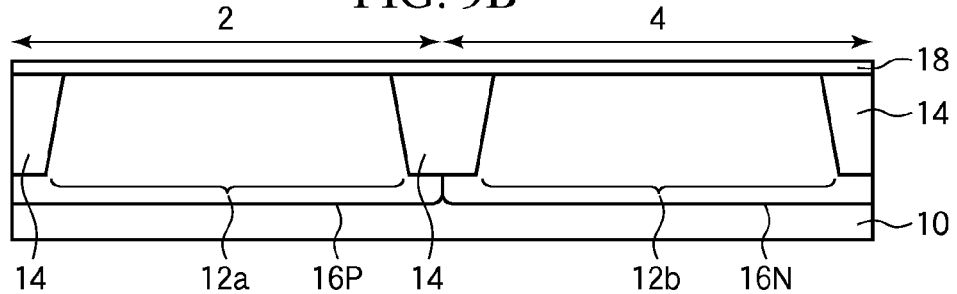

Next, in the same way as in the semiconductor device manufacturing method described above with reference to FIG. 3C, the silicon oxide film 18 is formed (see FIG. 9B).

Figure 9C:
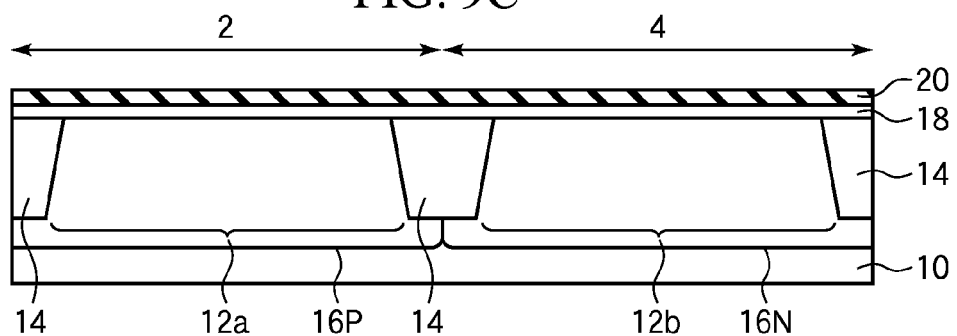

Next, in the same way as in the semiconductor device manufacturing method described above with reference to FIG. 3D, the gate insulation film 20 is formed (see FIG. 9C).

Figure 9D:
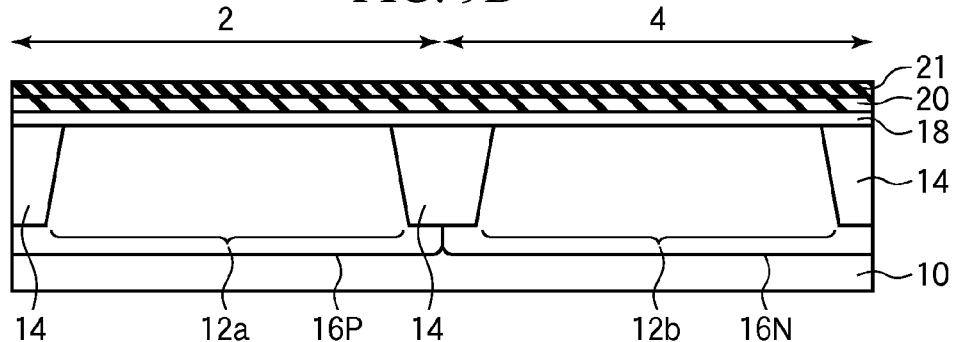

Next, as illustrated in FIG. 9D, the aluminum oxide film 21 of, e.g., a 0.1-1.0 nm film thickness is formed on the entire surface by, e.g., ALD. As the raw material gas, TMA (Tri-Methyl Aluminum), for example, is used. As the reaction gas, oxygen or ozone, for example, is used. The film forming temperature is set at e.g., about 300-600° C. The pressure in the film forming chamber is set at about 0.3-1.0 Pa.

Figure 10A:
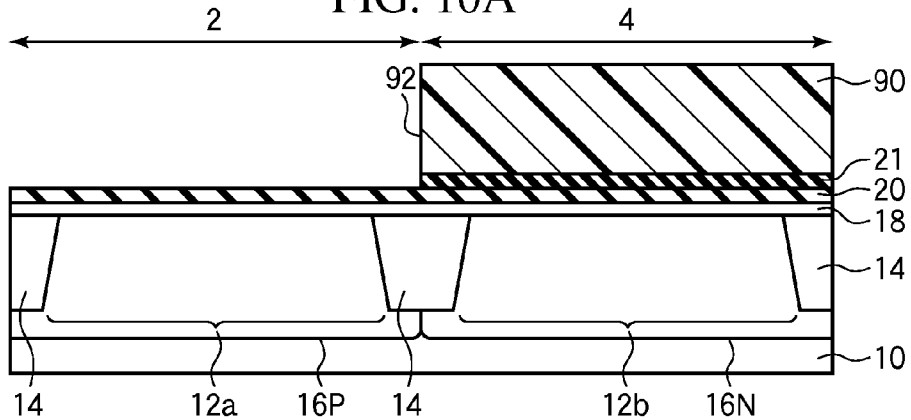

Next, as illustrated in FIG. 10A, a photoresist film 90 is formed on the entire surface by spin coating.

Then, an opening 92 for exposing the N-channel MISFET forming region 2 is formed in the photoresist 92.

Next, by wet etching, the aluminum oxide film 21 in the N-channel MISFET forming region 2 is etched off. As the etchant, TMAH (Tetra-Methyl Ammonium Hydroxide), for example, is used.

Then, the photoresist film 90 is removed. When the photoresist film 90 is removed, an organic solvent, such as acetone, thinner or others, is used so as to prevent the deterioration of the aluminum oxide film 21, the gate insulation film 20 and the silicon oxide film 18.

Then, thermal process (annealing) for diffusing the aluminum in the aluminum oxide film 21 while recovering the gate insulation film 20 from damages is made. The quantity of the aluminum diffused from the aluminum oxide film 21 is made sufficiently larger than the quantity of the rare earth metal, etc. to be diffused from the cap film 22 to be formed in a later step, whereby the threshold voltage of the P-channel MISFET 50a can be sufficiently shallowed. For this, in this thermal processing, it is preferable that the thermal processing temperature is made higher, or the thermal processing period of time is made longer than the thermal processing to be made after the cap film 22 has been formed. The thermal processing temperature is set at, e.g., about 1000-1100° C. The thermal processing period of time is set at, e.g., about 5-15 minutes. The atmosphere in the chamber is, e.g., nitrogen atmosphere.

Figure 10B:
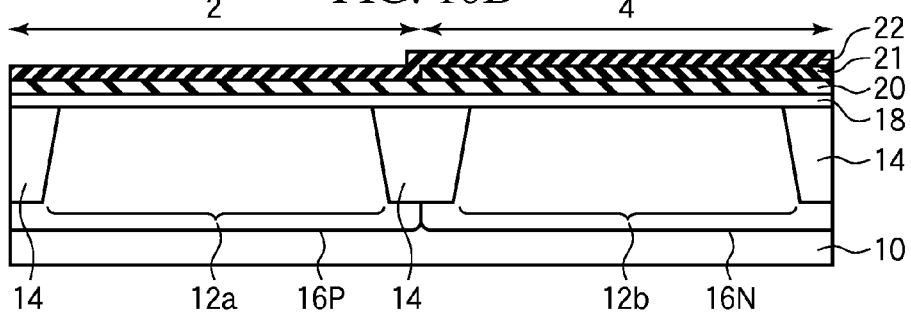

Next, in the same way as in the semiconductor device manufacturing method according to the first embodiment described above with reference to FIG. 4A, the cap film 22 is formed (see FIG. 10B).

The following steps of the semiconductor device manufacturing method are the same as those of the semiconductor device manufacturing method according to the first embodiment illustrated in FIGS. 4B to 7C, and their description will not be repeated.

Figure 10C:
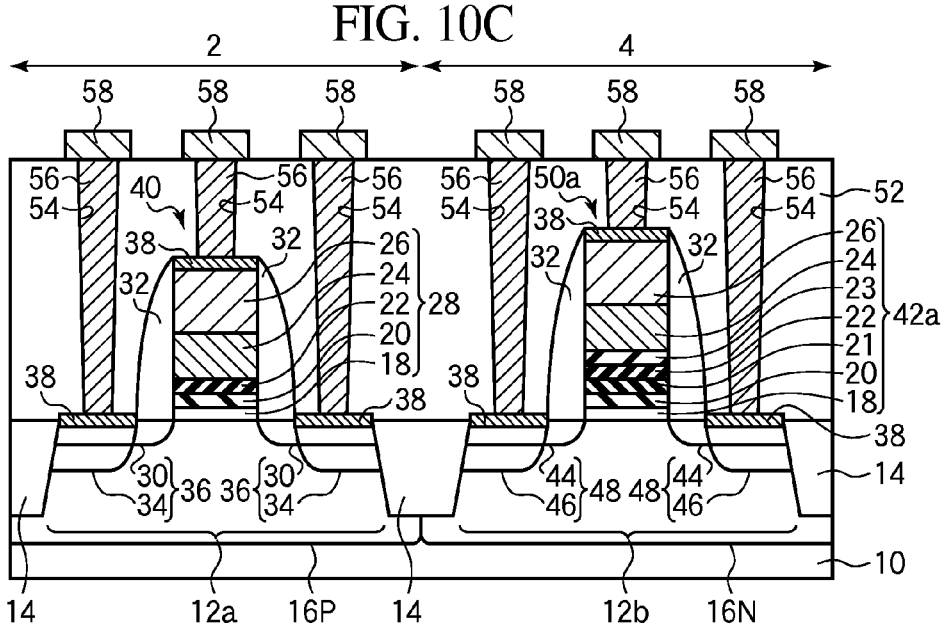

Thus, the semiconductor device according to the present embodiment is manufactured (see FIG. 10C).

Modified Embodiments

The present invention is not limited to the above-described embodiments and can cover other various modifications.

For example, the metal gate electrode 24 of the N-channel MISFET 40 and the metal gate electrode 24 of the P-channel MISFET 50, 50a are formed of the same material but may be made of different materials. For example, as a material of the gate electrode 24 of the N-channel MISFET 40, a material whose work function is near the value of the conduction band of silicon may be used. More specifically, a material whose work function is 4.4 eV or below may be used as a material of the gate electrode 24 of the N-channel MISFET 40. Such material is, e.g., TaSiN, TaCN or others. As a material of the gate electrode 24 of the P-channel MISFET 50, 50a, a material whose work function is near the electron band of silicon may be used. More specifically, a material whose work function is 4.8 eV or above may be used as a material of the gate electrode 24 of the P-channel MISFET 50, 50a. Such material is, e.g., Mo, Ru, Ti or others.

As the metal gate electrode 24, metal silicide may be used. That is, the metal gate electrode 24 may be formed of metal, metal nitride or a metal compound, such as metal silicide or others.

In the second embodiment, the aluminum oxide film 21 is formed between the gate insulation film 20 and the cap film 22, but the film formed between the gate insulation film 20 and the cap film 22 is not limited to the aluminum oxide film 21. For example, titanium oxide film, tantalum oxide film or others may be formed between the gate insulation film 20 and the cap film 22. The dipoles generated in the interface between the silicon oxide film 18 and the gate insulation film 20 due to the presence of the titanium oxide film formed between the gate insulation film 20 and the cap film 22 will be formed with the negative poles positioned on the side of the silicon oxide film 18 and the positive poles positioned on the side of the gate insulation film 20. Such directed dipoles will act to shallow the threshold voltage of the P-channel MISFET 50a. The diploes generated due to the presence of the tantalum oxide film formed between the gate insulation film 20 and the cap film 22 will be formed with the negative poles positioned on the side of the silicon oxide film 18 and the positive poles positioned on the side of the gate insulation film 20. Such directed diploes will act to shallow the threshold voltage of the P-channel MISFET 50a. Thus, titanium oxide film, tantalum oxide film or others may be formed between the gate insulation film 20 and the cap film 22.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a first gate insulation film that includes an oxide of Hf or an oxide of Zr, formed over a semiconductor substrate;
    a first cap film formed over the first gate insulation film, the first cap film including an oxide of a first material;
    a first silicon oxide film formed over the first cap film;
    a first metal gate electrode formed over the first silicon oxide film;
    first source/drain diffused layers formed in the semiconductor substrate on both sides of the first metal gate electrode and having a first conductive type;
    a second gate insulation film that includes an oxide of Hf or an oxide of Zr, formed over the semiconductor substrate;
    a second cap film formed over the second gate insulation film, the second cap film including the oxide of the first material;
    a second metal gate electrode formed directly on the second cap film; and
    second source/drain diffused layers formed in the semiconductor substrate on both sides of the second metal gate electrode and having a second conductive type.

2. The semiconductor device according to claim 1, wherein the first material is a rare earth metal or Mg.

3. The semiconductor device according to claim 2, wherein the rare earth metal is La, Y or Dy.

4. The semiconductor device according to claim 1, further comprising
    an aluminum oxide film, a titanium oxide film or a tantalum oxide film formed between the first gate insulation film and the first cap film.

5. The semiconductor device according to claim 1, wherein the first metal gate electrode and the second metal gate electrode include titanium nitride or tantalum nitride.

6. A semiconductor device comprising
    a first gate insulation film formed over a semiconductor substrate;
    a first cap film formed over the first gate insulation film, the first cap film including an oxide of a first material;
    a first silicon oxide film formed over the first cap film;
    a first metal gate electrode formed over the first silicon oxide film;
    first source/drain diffused layers formed in the semiconductor substrate on both sides of the first metal gate electrode and having a first conductive type;
    a second gate insulation film formed over the semiconductor substrate;
    a second cap film formed over the second gate insulation film, the second cap film including the oxide of the first material;
    a second metal gate electrode formed directly on the second cap film; and
    second source/drain diffused layers formed in the semiconductor substrate on both sides of the second metal gate electrode and having a second conductive type,
    a second silicon oxide film formed between the semiconductor substrate and the first gate insulation film; and
    a third silicon oxide film formed between the semiconductor substrate and the second gate insulation film.

7. The semiconductor device according to claim 6, wherein the first gate insulation film and the second gate insulation film include an oxide of Hf or an oxide of Zr.

8. The semiconductor device according to claim 6, wherein the first material is a rare earth metal or Mg.

9. The semiconductor device according to claim 8, wherein the rare earth metal is La, Y or Dy.

10. The semiconductor device according to claim 6, further comprising
    an aluminum oxide film, a titanium oxide film or a tantalum oxide film formed between the first gate insulation film and the first cap film.

11. The semiconductor device according to claim 6, wherein
    the first metal gate electrode and the second metal gate electrode include titanium nitride or tantalum nitride.

* * * * *